(12) United States Patent
Chisaka et al.

(10) Patent No.: US 7,030,542 B2
(45) Date of Patent: Apr. 18, 2006

(54) COMPOSITE PIEZOELECTRIC BODY

(75) Inventors: Makoto Chisaka, Osaka (JP); Osamu Kobayashi, Osaka (JP)

(73) Assignee: Tayca Corporation, Osaka (JP)

( * ) Notice: Subject to any disclaimer, the term of this patent is extended or adjusted under 35 U.S.C. 154(b) by 0 days.

(21) Appl. No.: 10/511,675

(22) PCT Filed: Apr. 4, 2003

(86) PCT No.: PCT/JP03/04388

§ 371 (c)(1),
(2), (4) Date: Oct. 18, 2004

(87) PCT Pub. No.: WO03/088369

PCT Pub. Date: Oct. 23, 2003

(65) Prior Publication Data

US 2005/0174016 A1    Aug. 11, 2005

(30) Foreign Application Priority Data

Apr. 18, 2002    (JP)    ............... 2002-115630

(51) Int. Cl.
*H01L 41/187* (2006.01)
(52) U.S. Cl. ............... 310/358; 310/800; 29/25.35
(58) Field of Classification Search ............... 310/800, 310/358; 29/25.35
See application file for complete search history.

(56) References Cited

U.S. PATENT DOCUMENTS

| | | | |
|---|---|---|---|
| 5,334,903 A * | 8/1994 | Smith | ............. 310/358 |
| 5,552,004 A * | 9/1996 | Lorraine et al. | ............. 310/334 |
| 5,658,706 A * | 8/1997 | Niki et al. | ............. 430/270.1 |
| 5,691,960 A * | 11/1997 | Gentilman et al. | ............. 367/155 |
| 5,886,454 A * | 3/1999 | Ito et al. | ............. 310/322 |
| 6,044,533 A * | 4/2000 | Bureau et al. | ............. 29/25.35 |
| 6,111,818 A * | 8/2000 | Bowen et al. | ............. 310/358 |
| 6,300,708 B1 * | 10/2001 | Itasaka | ............. 310/367 |
| 6,307,302 B1 * | 10/2001 | Toda | ............. 310/334 |
| 6,772,492 B1 * | 8/2004 | Takeuchi et al. | ............. 29/25.35 |
| 6,919,668 B1 * | 7/2005 | Nagahara et al. | ............. 310/358 |
| 2003/0127949 A1 * | 7/2003 | Nagahara et al. | ............. 310/334 |
| 2004/0227429 A1 * | 11/2004 | Yin et al. | ............. 29/25.35 |

FOREIGN PATENT DOCUMENTS

| | | | |
|---|---|---|---|
| JP | 8-119771 | | 5/1996 |
| JP | 2000-324599 | | 11/2000 |
| JP | 2001-025094 | * | 1/2001 |

OTHER PUBLICATIONS

K. A. Klicker et al.; Communications of the American Ceramic Society, Materials Research Laboratory, vol. 65, pp-C208-C210, Dec. 1982. Cited in the PCT search report.

* cited by examiner

*Primary Examiner*—Thomas M. Dougherty
*Assistant Examiner*—J. Aguirrechea
(74) *Attorney, Agent, or Firm*—Westerman, Hattori, Daniels & Adrian, LLP

(57) ABSTRACT

The present invention proves a piezoelectric composite comprising, as main components, a piezoelectric ceramic and a polymer having a bulk density of 0.4 g/cm$^3$ or less, the polymer including bubbles dispersed therein. Therefore, the piezoelectric composite of the present invention has a reduced bulk density, a high coefficient of electromechanical coupling in spite of the piezoelectric ceramic having a low volume ratio, a reduced acoustic impedance and a good processing character.

2 Claims, 2 Drawing Sheets

US 7,030,542 B2

COMPOSITE PIEZOELECTRIC BODY

FIELD OF THE INVENTION

The present invention relates to a piezoelectric composite which are suitable for an ultrasonic probe equipped in a transmitting and receiving device such as an ultrasonic diagnostic machine and an ultrasonic flaw detector, utilizing a resonance movement in the thickness direction of the piezoelectric composite (that is, a resonance movement in the longitudinal vibration).

Conventionally, a piezoelectric composite has been prepared by combining a piezoelectric ceramic having a high coefficient of electromechanical coupling with a polymer material having a low acoustic impedance, and therefore, it has been used in an ultrasonic probe as a piezoelectric transducer having a high coefficient of electromechanical coupling together with a low acoustic impedance.

While the ultrasonic probe is used in a transmitting and receiving device such as an ultrasonic diagnostic machine and an ultrasonic flaw detector, a voltage is applied to the ultrasonic probe to generate a sound wave, which is reflected on an object, and then, the returned sound wave is received by the ultrasonic probe, to be changed into a voltage signal for showing up on an image.

A piezoelectric transducer, which changes an electricity into a sound wave (alternatively, changes a sound wave into an electricity) in the ultrasonic probe, is generally made of a piezoelectric ceramic having a significantly high coefficient of electromechanical coupling, such as lead zirconate titanate (that is hereinafter referred to as "PZTs"), a single crystal of lead zinc niobate titanate (that is hereinafter referred to as "PZNT"). It is noted that such a single crystal is not defined as a ceramic in a precise sense, but the single crystal is included in the ceramic in the present invention.

However, the piezoelectric ceramic has a large gravity so that it has an acoustic impedance as high as 30 Mrayl, approximately, the acoustic impedance being obtained by the following formula: (gravity)×(sound velocity). Thus, a sound wave cannot be efficiently transmitted because of the difference in the acoustic impedance therebetween in the case where the object is of an organic material having a low acoustic impedance, although the piezoelectric ceramic has a high coefficient of electromechanical coupling. In addition, where the object has a relatively high gravity, and where an intermediate layer or a medium to the object is of a material such as water or an organic substance, a sound wave cannot be transmitted efficiently because of the difference of the acoustic impedance.

Thus, it has been expected to prepare a piezoelectric composite having a high coefficient of electromechanical coupling together with a relatively low acoustic impedance.

The piezoelectric composite is a composite material of a piezoelectric ceramic, having a high gravity and a high coefficient of electromechanical coupling, integrated with a polymer material, having a low gravity and a low acoustic impedance. Thus, the piezoelectric composite has a structure having a reduced acoustic impedance with maintaining a high coefficient of electromechanical coupling.

Generally, as the piezoelectric composite includes the piezoelectric ceramic at a lower volume ratio (that is, a ratio occupied by the piezoelectric ceramic in total), the acoustic impedance thereof is getting lower. However, a lower volume ratio of the piezoelectric ceramic results in a lower coefficient of the electromechanical coupling, because of the increase of a factor by the polymer which restricts a vibration movement of the piezoelectric ceramic. On the contrary, the higher the coefficient of electromechanical coupling is, the higher the acoustic impedance is.

As a polymer for the piezoelectric composite, silicone rubber materials having a soft and elastic property can be exemplified, which gives a piezoelectric composite having a high coefficient of electromechanical coupling although the piezoelectric ceramic is included even at a relatively low volume ratio. However, such silicone rubber materials are adverse in affinity with an adhesive agent, which is necessary for producing an ultrasonic probe, and are significantly bad in processing character in a cutting process, and therefore, they are not suitable in practically producing an ultrasonic probe. In addition, a piezoelectric composite generally has electrodes formed on the upper and lower surfaces for taking out electricity therefrom, and the silicone rubber materials are also adverse in affinity with the electrodes, so that they are disadvantageous in producing an ultrasonic probe, as explained above. Further, a polymer generally has a low bulk density, but it is as low as 1. Therefore, there is a limitation in reducing an acoustic impedance with keeping a high coefficient of the electromechanical coupling.

SUMMARY OF THE INVENTION

In view of the above, the present invention, as explained above, has the objectives in the prior art to be solved, providing a piezoelectric composite having a high coefficient of electromechanical coupling and a low acoustic impedance, that is also excellent in processing character during producing an ultrasonic probe without accompanied with any problems as explained above.

The objectives of the present invention are accomplished by providing a piezoelectric composite comprising, as main components, a piezoelectric ceramic and a polymer having a bulk density of 0.4 g/cm$^3$ or less, the polymer including bubbles dispersed therein.

In general, the piezoelectric composite of the present invention has a structure made of a piezoelectric material, that is an integrated body of a piezoelectric ceramic (noting that a single crystal is included in the present invention,) and a polymer, as main components. Depending on the configuration of the piezoelectric ceramic and the polymer, the piezoelectric composite is generally referred to as "1-3 composite," "2-2 composite," "0-3 composite," or "3-0 composite." The numbers such as "1-3," "2-2," "0-3" and "3-0" express the number of the end surfaces of the piezoelectric ceramic appearing in the x, y and z directions, and the number of the end surfaces of the polymer appearing in the x, y and z directions.

DETAILED DESCRIPTION OF THE INVENTION

The present invention is hereinafter described in detail based on a drawing of a best mode.

Figure 1:
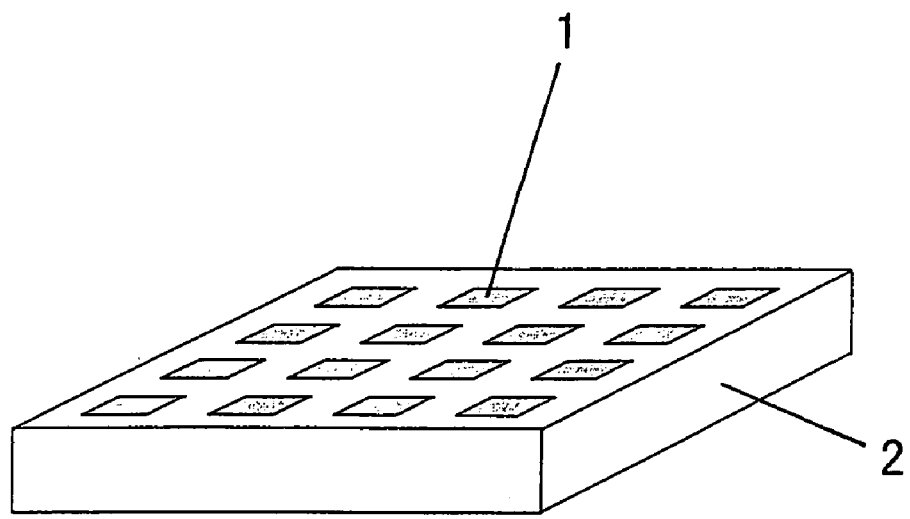
FIG. 1 illustratively shows a piezoelectric composite of an embodiment of the present invention, without showing electrodes.
Figure 2:
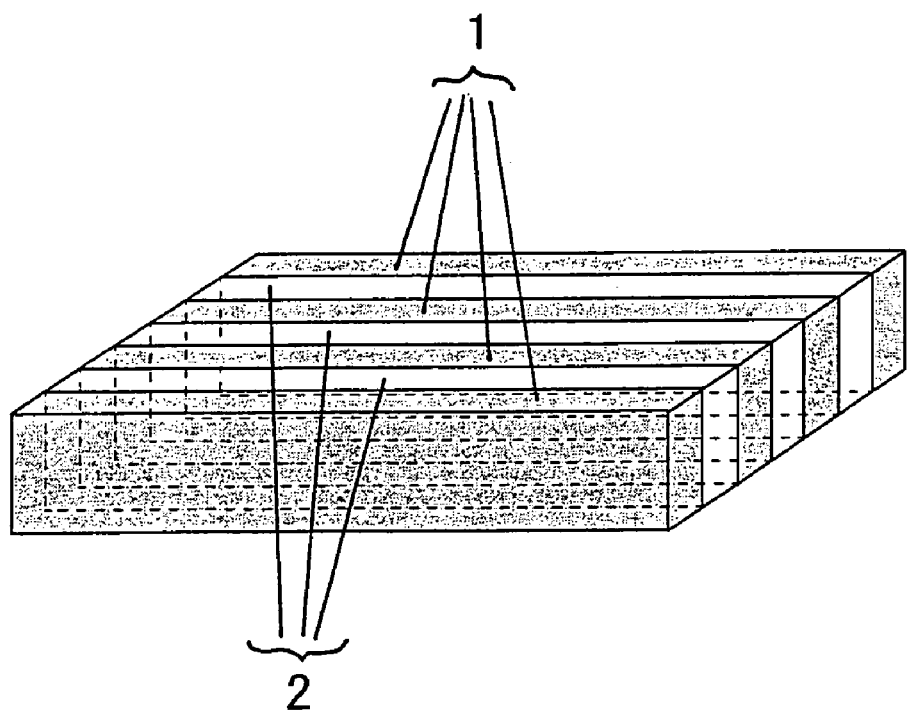
FIG. 2 illustratively shows a piezoelectric composite of another embodiment of the present invention, without showing electrodes.
Figure 3:
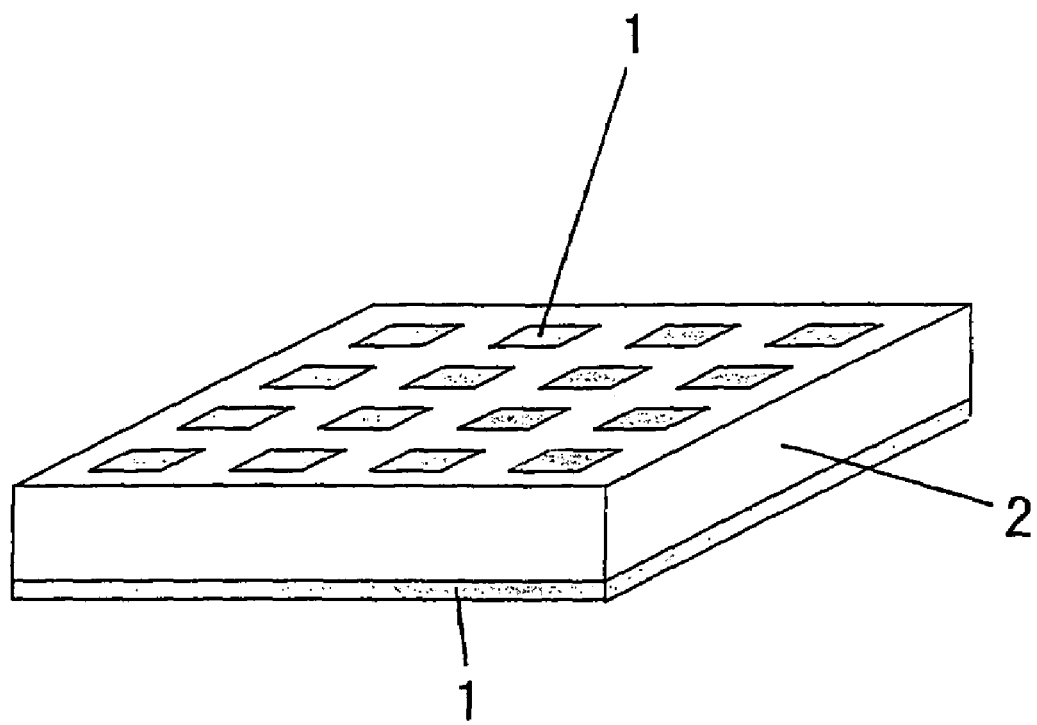
FIG. 3 illustratively shows a piezoelectric composite of another embodiment of the present invention, without showing electrodes.

First, the piezoelectric composite as shown in FIG. 1 is explained as follows. FIG. 1 illustratively shows a piezoelectric composite in an 1-3 type. The piezoelectric composite as shown in FIG. 1 has an end surface appearing a piezoelectric ceramic in one direction of x, y or z (namely, in the longitudinal direction), and end surfaces appearing a polymer in the three directions of x, y and z, and therefore, the embodiment is referred to as "1-3 composite." The piezoelectric composite of the 1-3 type is further described as follows: It has a plurality of rectangular columns of a piezoelectric ceramic 1 independently standing, whose surroundings are positioned by a polymer 2 including bubbles dispersed therein. The bubbles are not shown in the drawing. The polymer thus has a bulk density of 0.4 g/cm$^3$ or less. The piezoelectric composite generally has electrodes formed on the upper and lower surfaces. For clarification of the configuration of the piezoelectric ceramic 1 and the polymer 2, the electrodes are not shown in the drawing, but the piezoelectric composite of the drawing generally has electrodes formed on the upper and lower surfaces. In FIGS. 2 and 3 showing the piezoelectric composites, the electrodes are also abbreviated therein, but the embodiments generally have electrodes formed on the upper and lower surfaces. Also, the piezoelectric ceramic shown in FIGS. 1 to 3 are colored for the purpose to visually distinguish the piezoelectric ceramic 1 from the polymer 2.

FIG. 2 illustratively shows a piezoelectric composite in a 2-2 type. The piezoelectric composite as shown in FIG. 2 has end surfaces appearing a piezoelectric ceramic 1 in the two directions of x, y and z, and end surfaces appearing a polymer 2 in the two directions of x, y and z. The embodiment is thus referred to as a "2-2 composite." The piezoelectric composite of the 2-2 composite as shown in FIG. 2 is further described as follows: It has a piezoelectric ceramic 1 and a polymer 2, each being shaped into a rectangular plate and combined one with the other by positioning alternately. The polymer 2 includes bubbles dispersed therein, which are not shown in the drawing, thereby having a bulk density of 0.4 g/cm$^3$ or less.

The scope of the present invention does not include a "3-0 composite," in which there is no end surface of a polymer, because of the limitations of the production method. However, in addition to the embodiments of the 1-3 composite and 2-2 composite as shown above, the scope of the present invention should include an embodiment of a piezoelectric composite having a lower surface entirely formed by a piezoelectric ceramic 1, as shown in FIG. 3. The piezoelectric composite as shown in FIG. 3 is further described as follows: It is a modification of the piezoelectric composite of the 1-3 type, as shown in FIG. 1, by providing a further piezoelectric ceramic 1 entirely formed on the lower surface thereof. Thus, the rectangular columns of the piezoelectric ceramic 1 are connected to each other at the lower surface, and a polymer 2 is positioned at the surroundings of the rectangular columns. The polymer 2 includes bubbles dispersed therein, which are not shown in the drawing, thereby having a bulk density of 0.4 g/cm$^3$ or less.

The piezoelectric composite of the present invention is featured to comprise a piezoelectric ceramic and a polymer having a bulk density of 0.4 g/cm$^3$ or less, the polymer including bubbles dispersed therein, as main components. It would be considered that the state of the bubbles dispersed in the polymer reduces the polymer from restricting the piezoelectric ceramic vibration, so that a coefficient of the electromechanical coupling can be kept high, even though the volume ratio of the piezoelectric ceramic is kept low.

Also, the piezoelectric composite of the present invention includes bubbles dispersed in a polymer, thereby reducing its gravity, and thus resulting in becoming advantageous in reducing an acoustic impedance.

According to the present invention, the piezoelectric ceramic of the piezoelectric composite means a material to show a piezoelectric property at the time when it is applied to a polarization treatment between the electrodes formed thereon. The ceramic preferably includes PZT ceramic materials (that is, a lead zirconate titanate ceramic), a PZNT single crystal (that is, a single crystal of lead zinc niobate titanate), a single crystal of lead magnesium niobate titanate (PMNT), a ceramic of lead niobate, a ceramic of lead titanate, and a ceramic of bismuth titanate, in view of having a high coefficient of electromechanical coupling.

The polymer, which can be used in the piezoelectric composite of the present invention, may include an epoxy polymer, an acrylic polymer, an urethane polymer and the like, and in particular, it is preferable to use a relatively solid resin, such as an acrylic polymer and an epoxy polymer, in case of the needs of a strict mechanical processing character. It is noted that in accordance with the present invention, any polymer can be used to produce a piezoelectric composite having a reduced acoustic impedance with keeping a high coefficient of electromechanical coupling.

The piezoelectric composite of the present invention can be prepared by a first step for forming a plurality of grooves on a ceramic by means of a mechanical process; and a second step for filling a polymer powder into the grooves, the polymer powder enclosing a liquid which is to be gasified at a predetermined temperature, followed by being subjected to a heat treatment to form the polymer having a bulk density of 0.4 g/cm$^3$ or less, integrated with the ceramic. If necessary, the preparation method of the piezoelectric composite can be accompanied with a third step for removing an extra polymer and ceramic to adjust the thickness. Upon the formation of the grooves and the integration with the polymer, a ceramic is generally used which is not yet subjected to a polarization treatment, and then, electrodes are formed and subjected to the polarization treatment. Alternatively, a piezoelectric ceramic already subjected to a polarization treatment can be used, on which grooves are formed followed by integrating it with the polymer.

Upon the production of the piezoelectric composite of the present invention, a polymer powder enclosing a liquid is used, which is designed to be heated at a predetermined temperature so as to soften the polymer and vaporize the liquid enclosed in the polymer powder. The examples of the polymer includes an acrylonitrile copolymer enclosing a liquid such as isobutene, isopentane, n-pentane and n-hexane, and an urethane or epoxy resin enclosing a liquid such as isobutene and isopentane.

The polymer powder enclosing the liquid as exemplified is filled into the grooves formed in the ceramic, followed by heating it at a predetermined temperature. The raising of the pressure by the vaporized liquid and the softening of the polymer can expand the polymer, working to adhere and integrate it with the ceramic, thereby to form a polymer having an extremely low bulk density. Then, if necessary, the surfaces thereof are ground on the purpose of removing an extra ceramic and excessively adhered polymer or on the purpose of adjusting the thickness. Then, electrodes are formed by means of a sputtering, vacuum deposition and plating process. After forming the electrodes, a direct-current voltage is applied between the electrodes to subject it to a polarization treatment, producing a piezoelectric composite. For example, upon producing the piezoelectric composite of the 1-3 type as shown in FIG. 1, a body as shown in FIG. 3 is first prepared, and then, the piezoelectric ceramic positioned on the lower surface is ground to expose the polymer 2 at the lower surface. However, the body as shown in FIG. 3 can be used as it is, and in such a case, it is unnecessary to remove the piezoelectric ceramic 1 formed on the lower surface.

According to the present invention, the polymer in the piezoelectric composite density has a bulk density of 0.4 g/cm$^3$ or less. If the bulk density is higher than that, the restriction by such a polymer may become significant or reduce a coefficient of the electromechanical coupling, where a volume ratio of the polymer in a piezoelectric composite is the same as the product of the present invention. The bulk density of the polymer can be reduced as low as 0.05 g/cm$^3$, but in a practical point of view, the lower limit of the bulk density may be 0.1 g/cm$^3$.

Upon the mechanical process for forming the groove in the production of the piezoelectric composite, a slicer, a dicing saw and the like can be preferably used.

EXAMPLES

The present invention is hereinafter described in more detail based on the Examples. However, the present invention should not be construed to be limited into the Examples.

Example 1

As a ceramic for the piezoelectric ceramic, a PZT ceramic material was provided, which had a coefficient of the electromechanical coupling k33 of 80%, and a bulk density of 7.8 g/cm$^3$.

The ceramic was formed to have a shape of a plate having a thickness of 1.00 mm, on which grooves, each having a depth of 0.800 mm, were formed to be parallel to one side of the ceramic plate, at an interval of 200 μm, by using a blade having a width of 100 μm of a dicing saw. Then, grooves were formed in the perpendicular direction of the above, in the same manner, to form a PZT ceramic having a structure in which a plurality of rectangular columns standing, each having a size of 100 μm×100 μm×800 μm.

Then, an acrylonitrile copolymer resin enclosing isopentane were filled into the grooves formed on the PZT ceramic, followed by heating it at a temperature of 150° C. for a period of 5 minutes, to integrate the acrylonitrile copolymer resin with the PZT ceramic, the copolymer including bubbles dispersed therein. Then, the excess resin and PZT ceramic were removed by using a both sides grinder, adjusting the thickness, to form an 1-3 composite comprising the PZT ceramic at a volume ratio of 25%, having a thickness of 0.60 mm, each unit of the PZT ceramic having a size of 100 μm×100 μm.

The geometric size of the 1-3 composite obtained was measured by using a micrometer and a vernier caliper, and the weight was measured by a precision balance, to calculate the bulk density of the 1-3 composite. The results are shown in Table 1 below. The bulk density of the polymer component in the 1-3 composite was calculated to be 0.2 g/cm$^3$.

For the purpose to form electrodes on the upper and lower surfaces of the obtained 1-3 composite, a Ni chemical (electroless) plating process was applied on the upper and lower surfaces of the obtained 1-3 composite, followed by applying an Au chemical (electroless) plating process, so as to form electrodes comprising Ni having a thickness of 0.7 μm, and Au having a thickness of 0.3 μm thereon.

The four surfaces of the 1-3 composite were cut into a predetermined size, and then, a direct-current voltage of 1 kV/mm was applied at a temperature of 100° C. to carry out a polarization treatment, so as to obtain an 1-3 composite, as objective.

Frequency and impedance properties of the 1-3 composite were measured by Impedance Analyzer 4194A made by Hewlett-Packard Co. Using the measured resonant frequency (fr) and antiresonant frequency (fa) of the longitudinal vibration (in the thickness vibration), a "k constant (kt)" in the thickness direction was calculated in accordance with the test method of a piezoelectric ceramic transducer by the Electronic Material Manufactures Association of Japan. The results are shown in Table 1. The obtained resonant frequency (fr) and the bulk density were used to calculate an acoustic impedance. The results are shown in Table 1 below.

For the purpose of researching the processing character of the piezoelectric composite, a resin for an acoustic matching layer was applied on one of the electrode surfaces at a thickness of 0.6 mm, followed by cutting it by means of a dicing saw into a size of 10 mm×0.1 mm, to form 50 test pieces having a thickness of 1.2 mm shaped into a strip having a size of 10 mm×0.1 mm. The cut surfaces of the test pieces were observed by a physical microscope to research the presence of the peeling of the electrodes and the cracking of the piezoelectric composite. The results are also shown in Table 1.

Comparative Example 1

Except using the 1-3 composite as prepared here, Comparative Example 1 was carried out in the same manner as Example 1. Similar to Example 1, a PZT piezoelectric ceramic having rectangular columns standing, each having a size of 100 μm×100 μm×800 μm, was used. Into the grooves thereof, an acrylonitrile copolymer resin having a bulk density of the resin as 1.1 g/cm$^3$ was filled, followed by setting it to prepare an 1-3 composite. The obtained 1-3 piezoelectric composite had a volume ratio of 25%.

On the 1-3 piezoelectric composite of the Comparative Example 1, a bulk density, kt value, and processing character were researched in the same manner as Example 1. The results are shown in Table 1.

Comparative Example 2

Except using the 1-3 composite as prepared here, the piezoelectric composite of Comparative Example 2 was prepared in the same manner as Example 1. Similar to Example 1, a PZT piezoelectric ceramic having rectangular columns standing, each having a size of 100 μm×100 μm×800 μm, was used. Into the grooves thereof, a silicone rubber adhesive agent, having a bulk density of the silicone rubber of 1.0 g/cm$^3$, was filled, followed by setting it to prepare an 1-3 composite. The obtained 1-3 piezoelectric composite had a volume ratio of 25%.

On the 1-3 piezoelectric composite of the Comparative Example 2, a bulk density, kt value, and processing character were researched in the same manner as Example 1. The results are shown in Table 1. It is noted that the processing character (based on the peeling of the electrodes and the crack of the piezoelectric composite) was evaluated as follows: The number of the test pieces used in the evaluation is shown in the denominator (each of the test pieces having a thickness, shaped in a strip form having a size of 10 mm×0.1 mm, in a state of applying an resin for an acoustic matching layer), and the number of the test pieces showing any electrodes' peeling or any crack on the composite is shown in the numerator, as shown in Table 1.

TABLE 1

| Properties | Example 1 | Comp. Example 1 | Comp. Example 2 |
| --- | --- | --- | --- |
| Bulk density (g/cm$^3$) | 2.10 | 2.80 | 2.72 |
| kt (%) | 72 | 60 | 69 |
| Acoustic Impedance (Mrayl) | 4.9 | 8.0 | 7.2 |
| Processing Character: Peeling of the Electrodes (pieces/50 pieces) | 0/50 | 0/50 | 35/50 |
| Processing Character: Cracking (pieces/50 pieces) | 0/50 | 0/50 | 8/50 |

Apparent from the results shown in Table 1, the piezoelectric composite of Example 1, although it had the same volume ratio as the conventional piezoelectric composites of Comparative Examples 1 and 2, was found to have a higher "kt" value, that is, a coefficient of electromechanical coupling, and a lower acoustic impedance, and in addition a better processing character, which is necessary in producing an ultrasonic probe, compared with the Comparative Examples.

The piezoelectric composites of Comparative Examples 1 and 2 had the same piezoelectric ceramic, the same volume ratio, and the same 1-3 composite structure as the piezoelectric composites of Example 1. However, the piezoelectric composite of Comparative Example 1 had a good processing character, but it had a lower "kt" value and a higher acoustic impedance. Also, the piezoelectric composite of Comparative Example 2 had a good "kt" value, but it was bad in processing character, and in particular, bad in adhesiveness with the electrodes.

Industrial Applicability

As explained above, the piezoelectric composite of the present invention has a reduced bulk density, a high coefficient of electromechanical coupling in spite of the piezoelectric ceramic having a low volume ratio, a reduced acoustic impedance and a good processing character.

Therefore, the piezoelectric composite of the present invention can be suitable for an ultrasonic probe equipped in a transmitting and receiving device such as an ultrasonic diagnostic machine and an ultrasonic flaw detector, utilizing a resonance movement of the piezoelectric composite in the direction of the thickness (that is, a resonance movement of the longitudinal vibration).

What is claimed is:

1. A piezoelectric composite, comprising:
    a piezoelectric ceramic portion; and
    an acrylonitorile copolymer portion having a bulk density of 0.2 g/cm$^3$ or less, wherein the acrylonitorile copolymer portion includes bubbles dispersed therein.

2. A method for preparing a piezoelectric composite, comprising:
    providing a ceramic portion;
    forming a plurality of grooves on the ceramic portion by means of a mechanical process;
    filling a powder of an acrylonitorile copolymer into the grooves, the powder enclosing a liquid; and
    heating the ceramic portion filled with the powder at a temperature to vaporize the liquid, to set and integrate the acrylonitorile copolymer with the ceramic portion, wherein the set acrylonitorile copolymer has a bulk density of 0.2 g/cm$^3$ or less.

* * * * *